United States Patent [19]

Aiassa

[11] Patent Number: 4,782,545
[45] Date of Patent: Nov. 8, 1988

[54] APPARATUS FOR OPERATING AND CONTROLLING MACHINES CLEANING THIN METAL OR METAL COATED SHEETS AND BOARDS

[76] Inventor: Umberto Aiassa, Via Zarotto No. 38, 43100 Parma, Italy

[21] Appl. No.: 44,713

[22] Filed: May 1, 1987

Related U.S. Application Data

[63] Continuation-in-part of Ser. No. 791,553, Oct. 25, 1985, abandoned.

[30] Foreign Application Priority Data

Oct. 25, 1984 [IT] Italy .............................. 46870 A/84

[51] Int. Cl.⁴ ............................................. A46B 13/04
[52] U.S. Cl. ........................................ 15/77; 15/102; 51/80 A
[58] Field of Search ............... 15/77, 102; 51/22, 23, 51/80 A, 87 R

[56] References Cited

U.S. PATENT DOCUMENTS

| | | | |
|---|---|---|---|
| 3,060,477 | 10/1962 | Wechsler | 15/77 |
| 3,995,343 | 12/1976 | Horner | 15/77 |
| 4,129,919 | 12/1978 | Fitch et al. | 15/77 |
| 4,250,588 | 2/1981 | Cook et al. | 15/77 |

Primary Examiner—Edward L. Roberts
Attorney, Agent, or Firm—Birch, Stewart, Kolasch & Birch

[57] ABSTRACT

An apparatus for operating and controlling board-cleaning machines having at least one horizontal cylindrical brush (17) comprises means (1,3) capable of detecting the forward movements of the boards (14) to be cleaned, a memory for storing the length (A) of the boards (14), at motor unit (7) for driving at least one brush (17) in a direction of rotation normally the same as the direction of movement of the boards (14), and also a processor (5) which collects the signals emitted by the means (1,3), compares them with the data stored in the memory and then processes them in order to operate the motor unit (7) so that it causes at least one brush (17) to rotate, while the latter is engaged with the rear end part of the board (14) being processed, at a speed having an absolute value greater than or equal to zero and in the opposite direction to the direction of movement of the board (14).

6 Claims, 6 Drawing Sheets

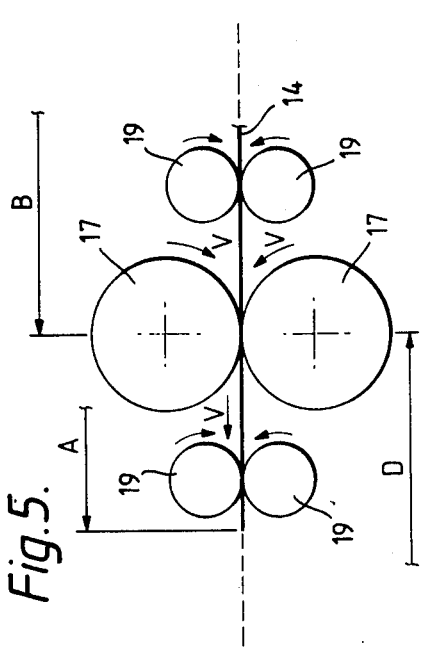
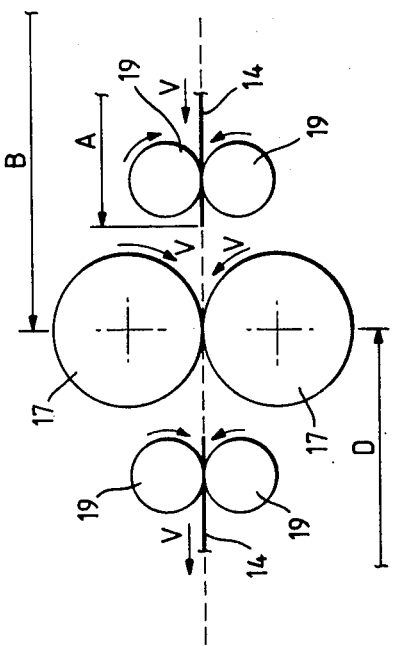
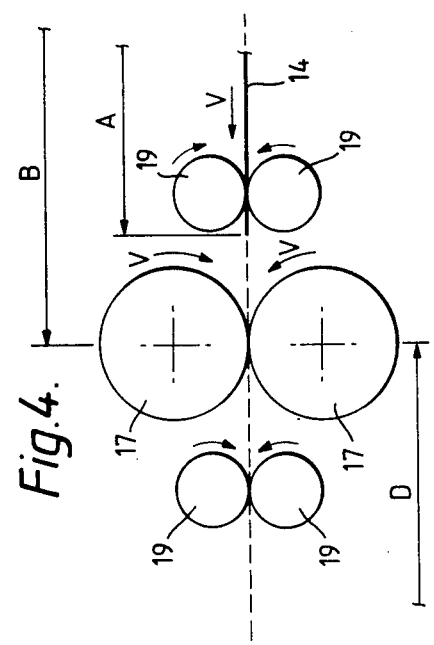
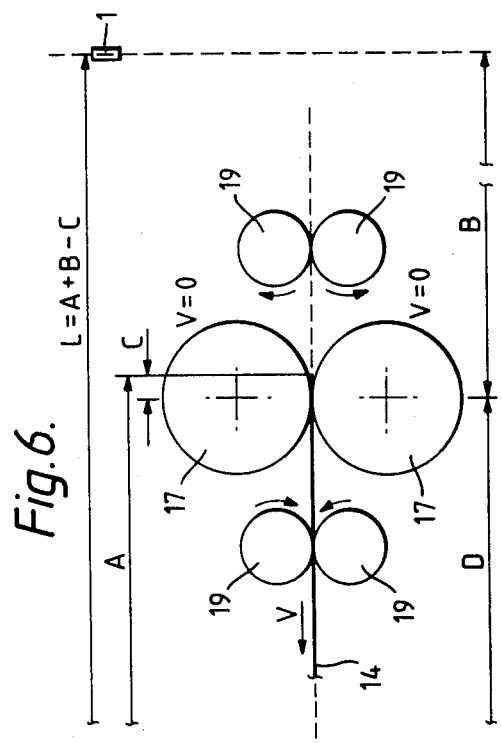

APPARATUS FOR OPERATING AND CONTROLLING MACHINES CLEANING THIN METAL OR METAL COATED SHEETS AND BOARDS

This is a continuation-in-part of application Ser. No. 791,553 filed Oct. 25, 1985 and now abandoned.

The present invention relates to an operating and control apparatus by means of which machines designed to clean boards for making printed circuits and metal sheets commonly used in the sector of chemical machining or milling are enabled to polish, without even the slightest damage, boards or sheets of any thickness, even very thin ones.

As is known, boards consisting of a base sheet on which there is, at least on one side, a very thin layer of copper, are generally used to make printed circuits, whereas thin metal sheets are used for the chemical machining of small metal details. Before being used, the said boards and sheets must be perfectly cleaned, so as to remove the dirt and any traces of oxidation which otherwise would give rise, at the end of the manufacturing cycle, to rejects and defective products.

Various known types of machines are used for the said cleaning or polishing operation and these are briefly mentioned below. Generally, the known machines for cleaning the said boards and sheets comprise, for each individual surface to be cleaned, at least one rotatable, horizontal, cylindrical brush with which, by way of a contrasting member, a rotatable opposing roller or a conveyor belt may be associated. The boards or sheets are made to advance by special pairs of superimposed drive rollers, and at least one brush of the said known cleaning machines rotatates constantly in one direction only, which is the same as the direction of transfer of the boards or sheets so as to promote their forward movement.

At this juncture, it is pointed out that, so as not to complicate unduly the text, reference will always be made hereinafter to printed circuit boards, although the term "boards" is also understood to mean, as can be deduced from what was stated above, metal sheets intended for chemical milling or machining.

According to the known prior art, the brushes of the said cleaning machines may be of various kinds, for example of the compact type, i.e. consisting of a set of discs made of suitable material, for example felt commonly known as "SCOTCH BRITE" or some other equivalent material, or else consisting of a multiplicity of longitudinal strips made of the same material and radially fixed to a central attachment core.

It is also known that the abovementioned elements made of SCOTCH BRITE or some other equivalent material are impregnated with a suitable abrasive material.

In addition, in certain types of known cleaning machines, use is made of brushes comprising a multiplicity of radial filaments which are impregnated with a suitable abrasive material as in the cases cited above. Finally, cleaning machines are known, the brushes of which comprise a plurality of nylon bristles which are kept moist with a suspension of pumice in water. In the case of the known machines mentioned above, it is possible to clean boards with a thickness of the order of 0.30 to 0.20 mm, this latter measurement constituting the operating limit of similar machines.

In fact, when one considers boards of smaller thickness, for example of the order of 0.15 to 0.10 mm, they are irreparably damaged since they are unable to withstand the thrust which the said at least one brush applies to the passing board in the direction of its movement. The said thrust gives rise to a peak load which is transmitted in two ways and in two successive stages.

During a first stage, a peak load is transmitted to the rear end part of the board by means of friction between the brush and the passing board.

During the subsequent phase, the peak load, which is more damaging than the previous one, is transmitted, when the board is about to leave the brush, by the active generatrices of the brush moving against the rear or exit edge of the board.

When the end part of a board is situated opposite the brush, the said end part is practically free and, therefore, if the board, on account of its limited thickness, is not sufficiently rigid, it is unable to withstand the abovementioned peak loads and gives way, curling up.

So as to be able to clean boards with a thickness of 0.15 to 0.10 mm, in accordance with the known prior art the abovementioned machines are equipped with suitable guiding members which have the function of keeping the rear part of the boards perfectly flat in order to prevent them curling up, bending or even breaking, which would mean that they could not be subsequently used.

The said known guiding members in some cases consist of plates which are arranged upstream and downstream of the said at least one brush and which converge towards the point of contact between the brush and the passing boards.

In other cases as well, the said members comprise metal grids with rods located parallel to the direction of movement of the boards or else comprises series of parallel metal wires which are arranged obliquely in relation to the path followed by the boards.

However, even with these devices, the known cleaning machines are unable, on account of the said peak loads, to process boards with a thickness less than 0.10 mm, for example 0.06 mm.

Therefore, when boards with a thickness of less than 0.10 mm must be cleaned, this operation is performed manually and requires a great deal of time and a large labour force, the latter having to perform a tedious and repetitive job.

It is also pointed out that the abovementioned problems assume particular importance in view of the fact that in modern electronics, and in particular microelectronics, the use of extremely thin boards, with thicknesses of much less than 0.10 mm, is becoming more and more widespread.

For example, these extremely thin boards are commonly used to make so-called multilayer electronic circuits consisting of a set or "sandwich" of printed circuits. In the sector of chemical machining as well, the use of extremely thin metal sheets, with thicknesses of less than 0.10 mm as stated above, is becoming increasingly widespread.

It is an object of the present invention to provide an operating and control apparatus by means of which the known abovementioned polishing machines are enabled to clean any known type of board, even an extremely thin board, all of which being within the framework of a simple and rational structure.

In addition, it is an object that the use of an apparatus according to the invention enables the said known machines to clean the said extremely thin boards perfectly and without the aid of the above-mentioned guiding members which, in addition to being costly, complicated as regards design, subject to rapid wear and difficult to maintain, in many cases give rise to a non-uniform cleaning effect with bands or strips polished to varying degrees.

The main idea underlying the invention is that of providing an operating and control apparatus which is able to operate the brush(es) is such a way that the board being processed is not subjected to the above-mentioned peak loads which, as has been seen, are the reason why the said extremely thin boards cannot be polished.

According to the invention, this is achieved by means of an apparatus which comprises a reading member capable of detecting the entry of the boards into a cleaning machine, a device designed to control the forward movements of the boards, a memory for storing the dimension of the side of the board which is parallel to the direction of movement of the latter, a bidirectional motor for driving at least one brush made to normally rotate in the same direction as the feeding direction of the boards, all of which are controlled by a processing unit which collects the signals arriving from the said member and device and compares them with the data contained in the said memory in order to operate the said motor so as to cause the said at least one brush to rotate, while the latter is acting on the rear end part of the board, at a velocity having absolute values greater than or equal to zero, and in the opposite direction to the direction of movement of the boards.

To said reading member, according to the invention, may consist of a simple photocell, the device for controlling the movements may, for example, consist of an encoder intended to be associated with the members designed to move the boards through a cleaning machine, the motor for driving the brushes is of the self-braking type, and a selector, by means of which the apparatus may be set for different methods of operating depending on work requirements, is associated with the processing unit.

According to a first method of operation, the apparatus, by means of its own processor, operates the motor driving the brush of the cleaning machine in such a way that the said brush, which is normally made to rotate in the same direction as the direction of movement of the boards, is stopped, and is immediately made to rotate in the opposite direction before the rear edge of the board leaves the drive members located upstream of the brush, and stopped again and then restarted with the same direction of rotation as the direction of movement of the board when the rear edge of the latter has left the brush.

According to a second method of operation, the processor operates the brush driving motor in such a way that the said brush, which is normally made to rotate in the same direction as the direction of movement of the boards, is simply stopped before the rear edge of the board being processed leaves the brush, and again made to rotate in the same direction as the direction of movement of the boards when the rear edge of the board being processed has left the brush.

The third position of the said selector corresponds to the processing of rigid boards, and, when the apparatus is set thus in practice, the processor is excluded and the motor constantly drives the brush so that it rotates in the same direction as the direction of movement of the boards. According to a constructional variation, the apparatus provides for the brush to be supported by two slides which are perpendicular to the plane of movement of the board, as well as means for raising and lowering the said brush from and onto the said plane, when the said brush is engaged with the end part of the board, the said means being in turn operated by the processor.

According to this variation, the apparatus may perform the two methods of operation described above as well as a third method according to which the processor operates the slide raising means in such a way that the brush, while continuing to rotate in the same direction as the direction of movement of the boards, is separated from the board being processed before the rear edge of the latter leaves the brush, and is brought again, after the rear edge of the board being processed has left the brush, into a position which intersects the path followed by the boards.

The characteristic features and constructional advantages of the invention will be explained more clearly during the course of the following detailed description given with reference to the figures in the attached plates of drawings which illustrate, by way of a purely non-limiting example, two preferred embodiments of the invention as applied to a conventional machine of the type with nylon brushes impregnated with a suspension of pumice in water.

FIG. 1A shows additional details of the blocks of FIG. 1.

FIGS. 4, 5, 6 and 7 show, in diagrammatic form, various moments during polishing performed in accordance with a method of operation of the invention shown in FIG. 1.

Figure 1:
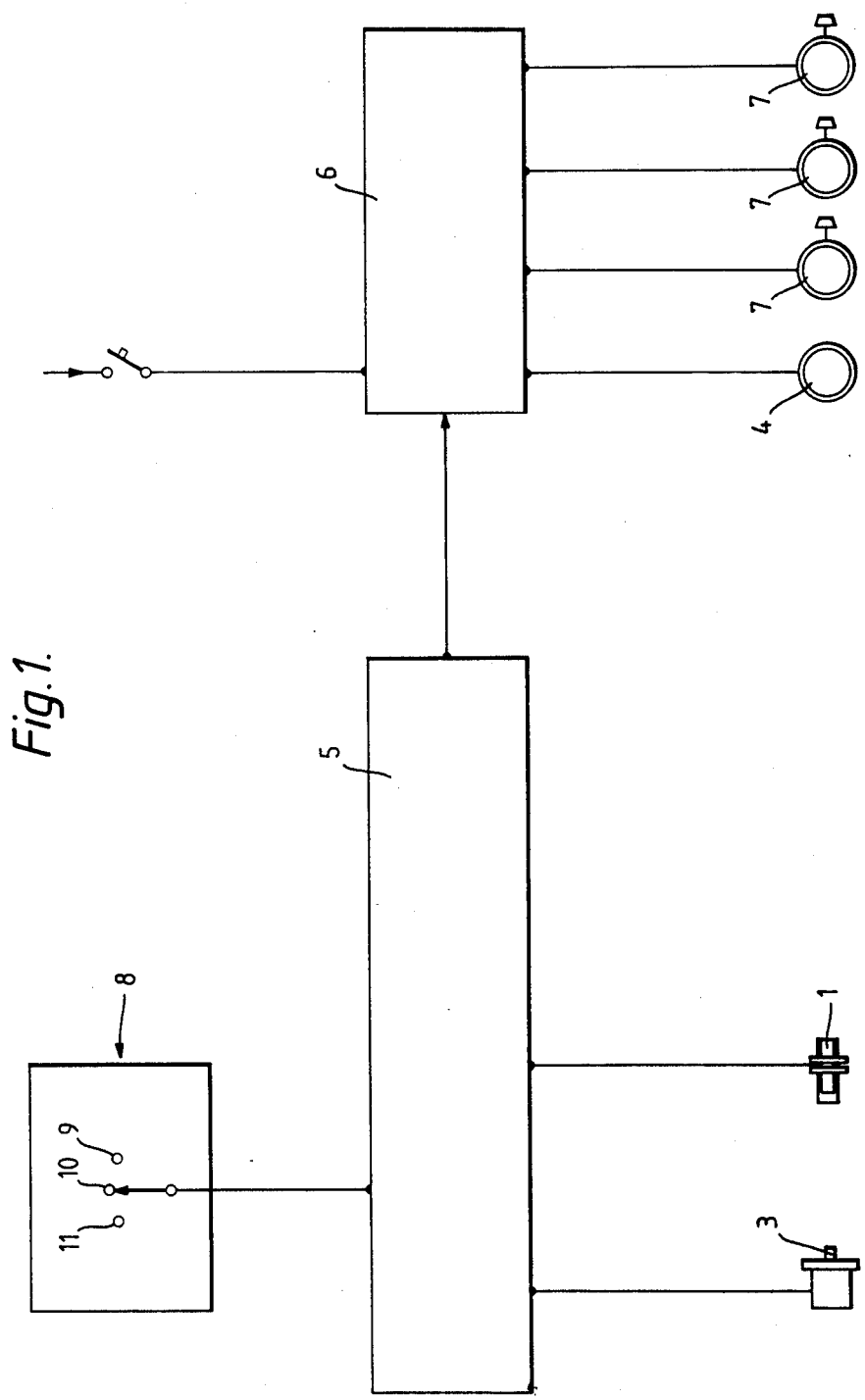
FIG. 1 is a block diagram of the invention in accordance with a first embodiment.

FIGS. 8, 9 10 and 11 are diagrammatic views, similar to the preceding ones, showing how polishing occurs in accordance with a different method of operation of the invention shown in FIG. 1.

Figure 2:
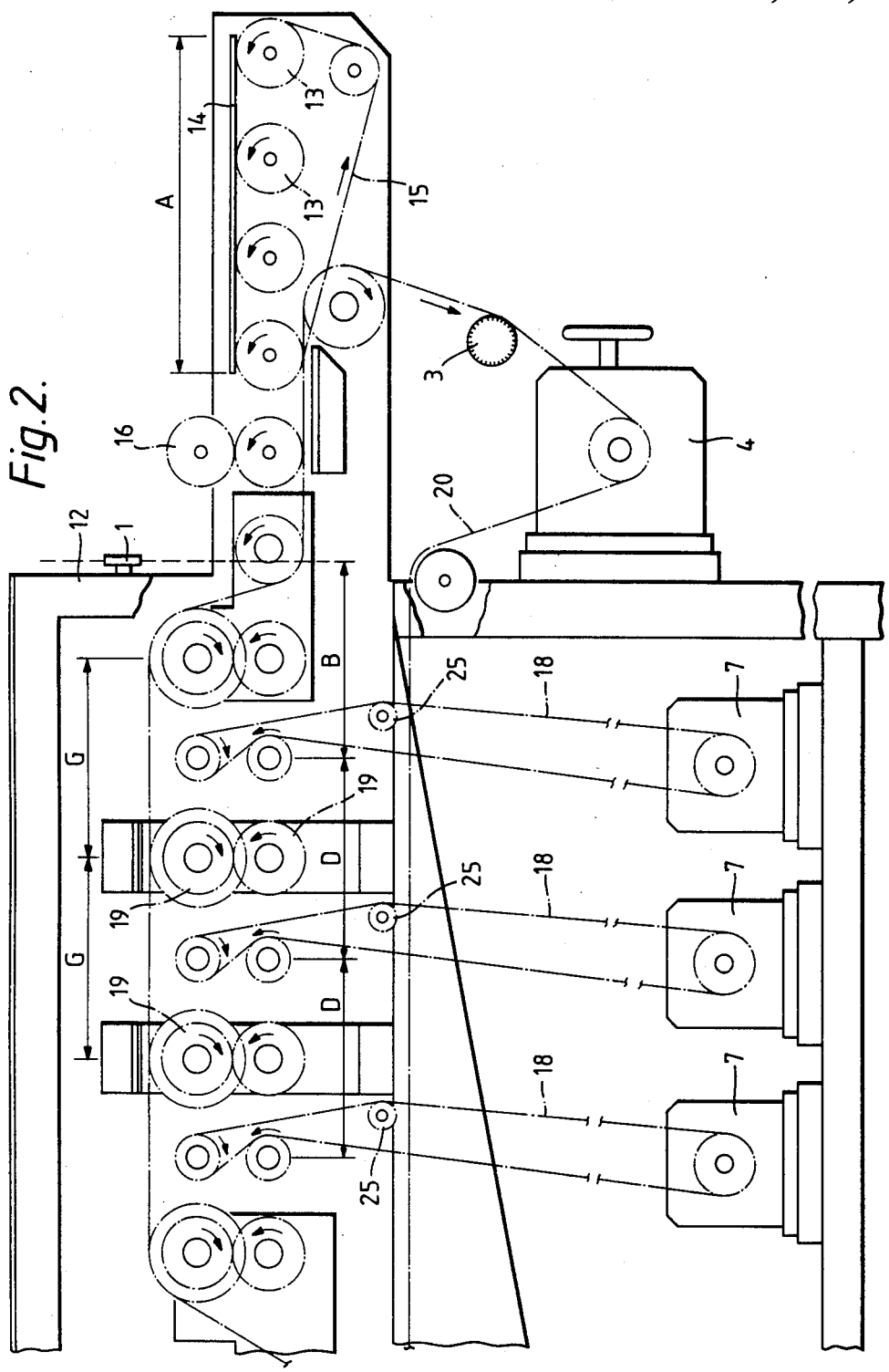
FIG. 2 is a schematic side view of the front part of a conventional cleaning machine equipped with the invention.
Figure 3:
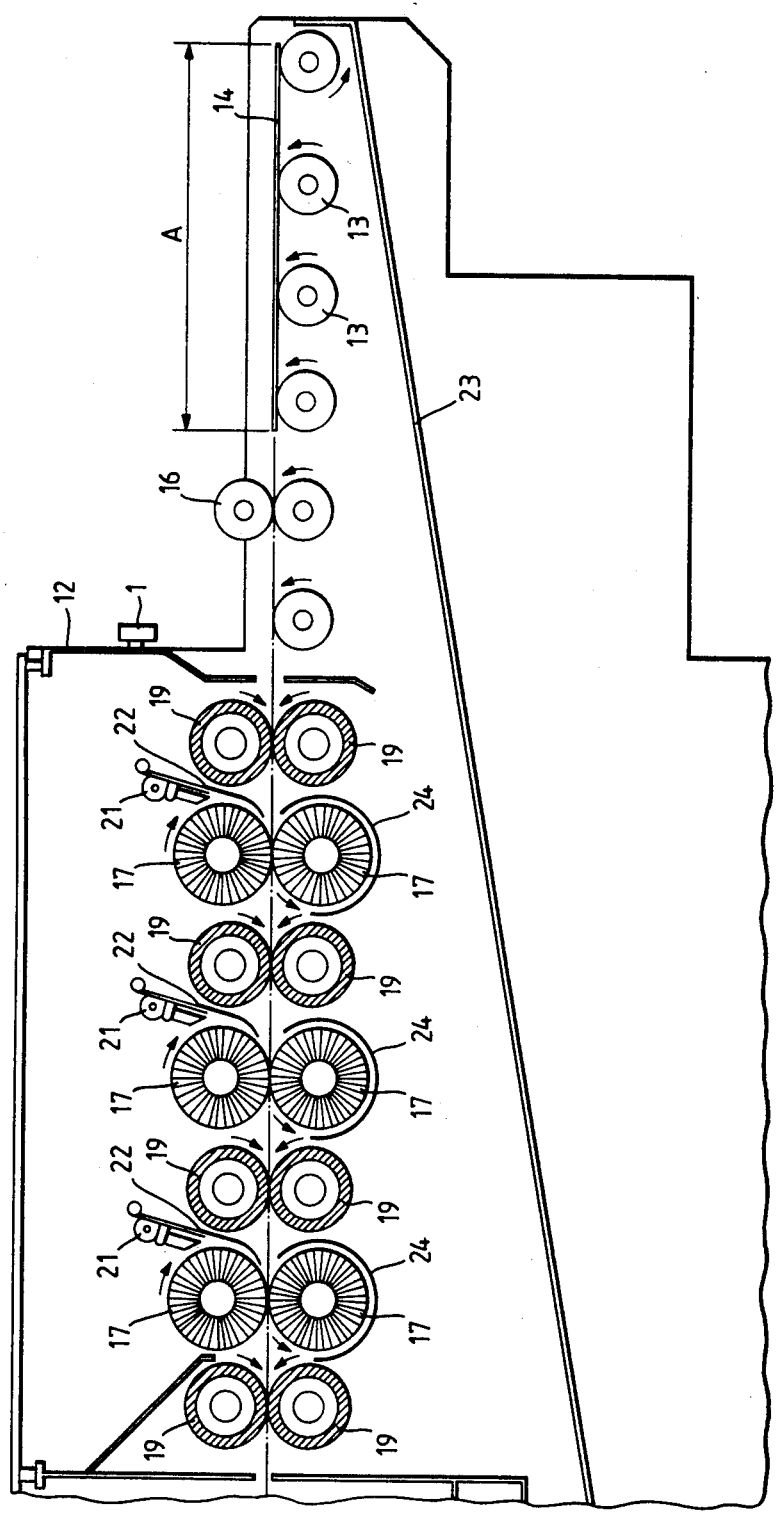
FIG. 3 is a longitudinal vertical section through the machine part shown in FIG. 2.
Figure 8:
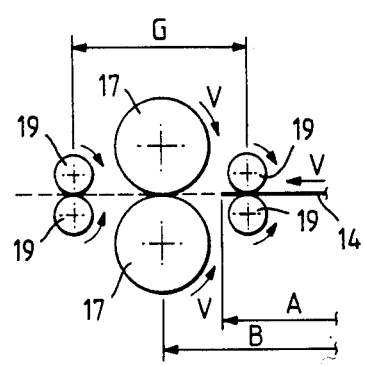

FIGS. 12, 13, 14 and 15 are diagrammatic views which show various moments during polishing of a board as performed by the machine shown in FIGS. 2 and 3 equipped with an apparatus in accordance with a second embodiment.

Before proceeding with the description of the invention, it is pointed out that the particular type of cleaning machine shown, to which the apparatus is applied, must not be regarded as limitative in any way since the invention can be applied, with identical results, to any known machine for polishing boards.

More precisely the invention may be applied to: machines provided with compact brushes or brushes with abrasive or nylon bristles as in this case; machines where the brush or brushes operate in conjunction with respective opposing rollers; machines where the brush or brushes are situated opposite a conveyor belt; as well as machines provided with one or more pairs of superimposed brushes.

The block diagram shown in FIG. 1 shows a reading member 1 for detecting the presence of the boards and for reading their length, which member 1, which is in the form of a photocell, is connected to a processing unit 5 to which a device 3 for detecting the movements of the boards is also connected.

As will be understood more clearly below, the length of the board is understood to mean the dimension of the side of a board which is parallel to the direction of movement of the boards through a conventional cleaning machine, for example that seen in FIGS. 2 and 3.

The said dimension, indicated by (A) in the figures, is intended to be entered in the memory of the previously mentioned processing unit 5.

According to the invention, the said device 3 consists of an encoder which is associated with means 4 of the cleaning machine designed to cause forward movement of the boards.

The abovementioned means 4 have been shown in schematic form in FIG. 1 for reasons of clarity, even though they do not belong to the invention, but instead to the machine to which the invention is intended to be applied.

The said processing unit 5 sends output signals to a power unit 6 to which three bidirectional motors 7 of the self-braking type are connected.

The number of these self-braking motors 7 may obviously be greater or less than that shown, depending on the type of cleaning machine to which the invention is intended to be applied.

Finally, a selector 8 with three positions, which are designated 9, 10 and 11 and to which a similar number of methods of operation of the aparatus correspond, is connected to the processing unit 5.

These different methods of operation are those referred to in the preamble.

The apparatus is controlled to perform its cleaning and polishing functions by a processing unit 5 which controls the power or switching unit 6. The operation of these units will later be explained.

As will be understood more clearly below, the abovementioned circuits allow the processor 5 to collect and process the signals arriving from the components 1 and 3 and to compare these signals with the data stored in the memories so as to operate the motors 7 in accordance with the abovementioned different methods of operation.

The machine shown in FIGS. 2 and 3 has been shown only partly since it is known per se as already stated.

This machine, to which the apparatus in question is applied, comprises a housing 12, the part situated above the operating zone being closed at the top.

A conveyor 13 for loading the boards 14 is arranged in cantilever fashion at the front of the housing 12, the said conveyor 13 consisting of a series of equidistant rubberised rollers provided with circumferential grooves.

The said conveyor 13 is operated by a chain 15 which engages with respective sprocket wheels keyed onto the shafts of the said rollers 13.

Moreover, the downstream zone of the conveyor 13 has located above it the photocell 1 previously described with reference to FIG. 1.

It is also pointed out that the boards 14 are straight and normally rectangular shaped, and are loaded in succession onto the conveyor 13 with a side parallel to the direction of their movement or, in other words, with a side parallel to the longitudinal extension of the machine.

The dimension of this side, indicated by (A) in the figure, is the item of data which is stored in the memory of the processor 5.

In order to prevent the boards 14 which are fed in from changing position or direction when they pass in front of the photocell 1, an additional rotating roller 16 which presses the boards 14 against a roller of the underlying conveyor 13 is provided immediately upstream of the said photocell. The said conveyor introduces the boards 14 into a polishing station which comprises three successive pairs of superimposed horizontal brushes 17 of the type with nylon bristles. Each pair of brushes 17 is operated, via a double-toothed belt transmission 18, by a respective self-braking motor 7.

Moreover, respective pairs of superimposed rollers 19 coated with a layer of rubber are arranged upstream and downstream of each pair of brushes 17 (FIG. 3), the said rollers having the function of gripping the incoming boards 14 and transferring them at a constant speed (v) through the polishing station. The rubberised rollers 19 of each pair are kinematically coupled to each other, and the upper rubberised rollers 19 of the said pairs are operated, via a chain transmission 20, by a speed-reducing unit 4 with a built-in variator (FIG. 2). Moreover, the chain 15 operating the conveyor 13 derives its movement from a double crown gear on which the chain 20 is driven (FIG. 2).

In view of the fact that standard boards 14 are particularly thin, such that they bend with extreme ease if they are not suitably supported, special support members, which have not been shown since they are known per se, are inserted between the rollers 19 and the brushes 17.

Subsequently, after the polishing phase, the boards 14 are introduced into successive washing/drying stations, not shown since they are known.

As shown in FIG. 3, the upper brush of each pair of brushes 17 is provided with a conventional device 21 for distributing a likewise conventional suspension of pumice in water, which device 21 is situated upstream in relation to said upper brush 17. Moreover, a shaped member 22, known per se, for conveying the said suspension towards the operating zone of the upper brush 17 is associated with the same device 21. The suspension is constantly re-mixed inside an appropriate storage tank from which a pump connected to 21 draws and into which a recirculation duct 23 discharges (FIG. 3).

On the other hand, as regards the lower brushes 17, each of them is accommodated inside a channel 24 where and said suspension of pumice in water is constantly present.

The motor 7, which is of the self-braking type as stated, according to the invention is able to rotate in two opposite directions as will be explained more clearly below and, therefore, the members 21, 22 previously mentioned are also provided downstream of the upper brushes 17 but have not been shown for reasons of clarity and simplicity of the drawing.

Finally, the encoder 3 forming part of the apparatus in question is kinematically coupled to the chain 20 for operating the rollers 19 which feed the boards 14.

With reference to FIGS. 4 to 7, a description is given of polishing of a board performed by the machine described above, under the control of the apparatus in question, with the selector set to the position 10.

Before starting the machine, the selector 8 is set to the position 10, and the above defined dimension (A) is stored in the memory of 5, along with the other data which may relate to the polishing machine or to the boards being processed, as will be explained below.

In short, the apparatus, and hence the machine to which the latter is applied, are regulated so that the first pair of brushes 17 stops when the front edge of the board has travelled a distance (L) measured from the photocell 1 and given by the relation:

$$L = (A+B) - C,$$

where
A = dimension of the board as defined above (FIG. 2);
B = distance between the photocell 1 and the first pair of brushes 17 (FIG. 2);
C = distance between the rear edge of the board 14 and a point located upstream of the said rear edge, where the brushes 17 are to be stopped.

The said distance (C) is introduced into the memory circuits of the processor 5, where the distance (D) (FIG. 2) existing between two successive pairs of brushes is also introduced and stored, so that the second and third pairs of brushes 17 will be stopped when the board 14 being processed has travelled over two other distances given by the relations:

$$L' = L + D \text{ and } L'' = L + 2D.$$

As already stated, the encoder 3 is provided for reading the movements of the boards 14, the said encoder commencing counting or reading when a board 14 passes in front of the photocell 1.

The operating phases of only a single pair of front or upstream brushes 17 are described, since the other two pairs operate in the same manner as the said first pair.

Each board 14, see FIG. 4, is first of all taken up by the pair of upstream feed rollers 19 and fed (FIG. 5) between the two brushes 17 which rotate at a velocity (V) having the same direction as the direction of movement of the board 14, which moves at a velocity (v).

Subsequently, the board 14 is gripped between the downstream rollers 19 (FIG. 5) and, when the said board has travelled over the distance (L) as defined above (shown more clearly in FIG. 6), the processor 5 sends a signal to the motor 7, which stops, while the board 14 continues to move since it is fed through by the downstream rollers 19.

The motor 7 is kept stationary for a sufficient period of time to allow the rear edge of the board 14 to leave the brushes 17, and, before another board 14 reaches the brushes (see FIG. 7), the motor 7 is restarted so as to drive the brushes 17 again at a velocity (V).

Therefore, upon leaving the machine, the board 14 is complete and perfectly clean, except for a small end strip, which is unimportant since, as is known, for the manufacture of a printed circuit and the chemical machining of metal details, only the middle part of the board and, respectively, of the metal sheet, is used, whereas the peripheral frame of said board and sheet acts as an element for centering/supporting the part being polished or machined, which is subsequently separated from the peripheral frame.

According to another method of operation, corresponding to the position 9 of the selector, the apparatus is arranged so that the cleaning machine shown in FIGS. 2, 3 operates as described below with reference to FIGS. 8 to 11. The selector 8 is set to the position 9, and the dimension (A) defined above, as well as the other data referred to below, are entered in the memory.

Finally, the apparatus, and hence the machine, are regulated so that the first pair of brushes 17 reverses its direction of rotation when the front edge of the board has travelled over a distance $L^1$ measured from the photocell 1 and defined by the relation:

$$L^1 = (A+B) - C'$$

where
A = dimension of the board 14 as defined above (FIG. 2);
B = distance between the photocell 1 and the first pair of brushes 17 (FIG. 2);
C' = a distance slightly greater than the distance between the contact generatrices of a pair of rollers 19 and the contact generatrices of the pair of brushes 17 located downstream.

The distance (C') is entered in the memory circuits of the processor 5, where the distance (G) (FIG. 2) existing between two successive pairs of feed rollers 19 is also introduced or stored, so that the second and third pairs of brushes 17 are stopped and immediately made to rotate in the opposite direction, i,.e. at a velocity (−V), when the board 14 being processed has travelled over two other distances defined by the relations:

$$L^{1'} = L^1 + G \text{ and } L^1 2G.$$

It is obvious that the length (A) of the board must be <G. As in the previous case, the movements of the boards are detected by the encoder 3 which starts counting when a board 14 passes in front of the photocell 1.

The operating phases of the single upstream pair of brushes 17 are described, since the other two pairs operate in identical fashion.

Figure 9:
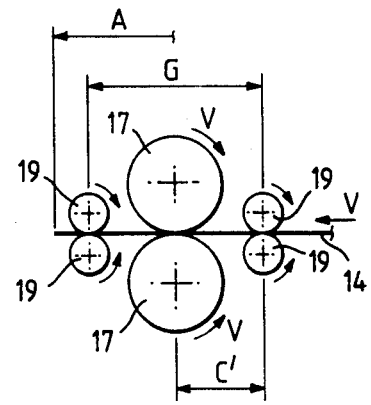

With reference to the attached FIGS. 8 to 11, it can be seen that initially the board 14 is gripped between the upstream pair of rollers 19 (FIG. 8) which feed it, causing it to move at a velocity (v), between the brushes 17 which are rotating at a velocity (V), in the same direction as the direction of movement of the board 14 (FIG. 9).

Figure 10:
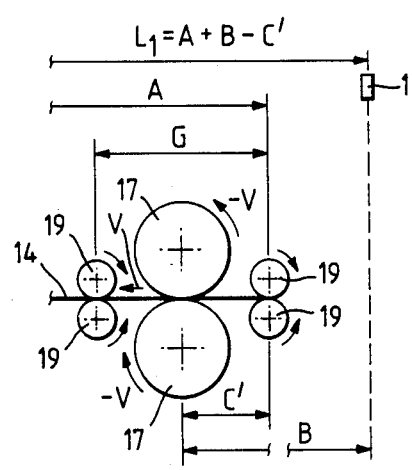

When the board 14 has travelled over a distance ($L^1$) as defined above, i.e. before the board leaves the upstream rollers, but not before the same board has been gripped by the downstream rollers, see FIG. 10, the processor 5 causes the motor 7 to stop and to re-start immediately in the opposite direction so that the brushes rotate at a velocity (−V) having a direction opposite to the direction of movement of the boards.

Therefore, since the brushes are rotating in the opposite direction, when the board leaves the upstream rollers it is not subjected to thrusts which cause peak loads, but to tensile stresses since it is pulled by the downstream rollers and held by the brushes.

Figure 11:
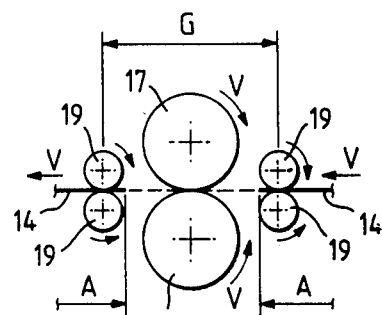
Figure 12:
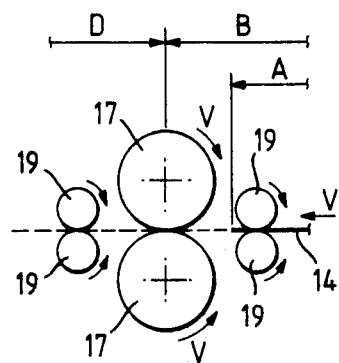
Figure 13:
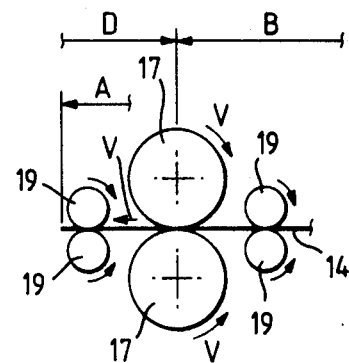
Figure 14:
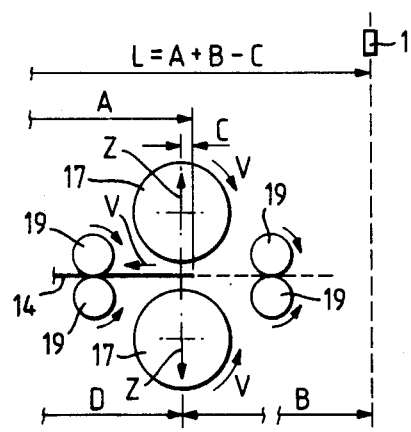

This rotation in the opposite direction continues until the rear edge of the board has left the brushes, after which the latter are stopped again and made to rotate at a speed (V) while awaiting another board (FIG. 11). In this case, the boards are therefore perfectly and completely polished on both surfaces, no zone being excluded.

Moreover, in order to prevent an unaesthetic shading effect occurring at the point where the direction of rotation of the brushes is reversed (FIG. 10), the three pairs of brushes are made to stop at different points, as defined below.

first pair of brushes $L^1 = (A + B) - C')$
second pair of brushes $L'^{11} = (A + B + G) - C''$
third pair of brushes $L''^{11} = (A + B + 2G) - C'''$ where (C") and (C'") are two measurements which differ from each other and differ from the distance (C') as defined above.

The said measurements (C") and (C'") must therefore be entered into the memory circuits of the processor 5.

However, from tests carried out it could be seen, with the naked eye, that there are no significant variations in the uniformity of the polished surfaces when rotation of the three pairs of brushes is reversed at the same point on the board.

Therefore, all the objects of the invention are achieved when the apparatus is set for the method of operation just described.

Moreover, as was stated with reference to FIG. 1, the processing unit 5 also has timing circuits by means of which it is possible to delay slightly restarting of the motor 7 after the latter has stopped. Finally, when the selector 8 of the invention is set to the position 11, in practice the processor 5 is eliminated and only the power unit 6 remains energised, so that the motors 7 operate continuously, with the brushes rotating constantly at a speed (V) in the direction of movement of the boards (14) or at a speed (−V) in the opposite direction to the said movement of the boards.

This method of use of the invention is particularly suitable for boards which are relatively thick and hence capable of withstanding the abovementioned peak loads resulting from friction or jamming as stated in the preamble. According to the invention, the apparatus may consist of another embodiment, according to which the same components as those shown in FIG. 1 are provided, including the selector 8, whose positions 9 and 11 correspond to the two methods of operation described above.

According to the said further embodiment, the processing unit 5 has branched off from it an appropriate control circuit not shown, which leads to sliding devices, for example in the form of cursors or slides, on which the ends of the shafts of the brushes 17 are intended to be mounted in rotating fashion.

The constructional details of the cursors have not been shown since they can be easily implemented by any mechanical engineer of average capability.

These slides or cursors, in fact, may be made to slide, upon a command generated by the processor 5, by means of hydraulic devices such as a cylinder/piston group, by means of electromagnetic means via an electrical actuator or even by means of a mechanical system with eccentrics or cams. As a specific example, the bearings in which the brushes rotate are mounted for vertical movement and can be retracted by pneumatic or hydraulic cylinders 40, having their piston rods 40' connected to the bearings, as shown at FIG. 2. The lower cylinders and their rods 40' are shown schematically. Each cylinder is spring loaded to normally maintain the brushes in the working position show at FIG. 2, in engagement with the boards. Pneumatic or hydraulic pressure applied to the rod ends of the cylinders retract the brushes to the positions shown at FIG. 14, in which the brushes are spaced from a board passing between the brushes.

When this further embodiment of the apparatus in question is adopted, the pulley 25 (FIG. 2) driving the belt 18 must be mounted on special elastic supports 42 so as to recover the travel of the said slides.

According to this solution, it is preferable to use one motor 7 for each brush 17, which motor will preferably be applied to one of the cursors of the brush.

As stated before, the methods of operation of this other embodiment are the same as regards the positions 9 and 11 of the selector 8, while the method of operation relating to position 10 is explained below with reference to FIGS. 12 to 15.

The dimension (A) defined above, as well as the distances (B) and (D) are entered in the memory of 5. In short, the apparatus, and hence the machine as well, are set so that each pair of brushes 17, while continuing to rotate at a velocity (V), loses contact with the board 14 being processed before the rear edge of the latter leaves the brushes. Finally, the three pairs of brushes move away from the semi-rigid board 14 after the latter has travelled over the three previously defined distances (L), (L') and (L"), which are counted by the components 1, 3, 5 (FIG. 1). Therefore, only the cleaning phase relating to the first pair of brushes is described.

From the said FIGS. 12 to 15 it can be seen that the board is first clamped between the upstream rollers 19 which cause it to move forward at a velocity (v) (FIG. 12); then it is fed between the brushes 17 which rotate at a velocity (V) and which at present are close to each other so as to make contact with the board being processed (FIG. 13); then, the same board is gripped between the downstream rollers 8 (FIG. 13); and, when it has travelled over the distance (L) defined above (FIG. 14), i.e. before its rear edge passes beyond the brushes 17, the processor 5, via the said control circuit, sends a signal to the means for actuating the said slides, so that the brushes, while continuing to rotate in the same direction as the direction of movement of the board, move away in the direction (z), losing contact with the board, which, therefore, is not damaged.

Figure 15:
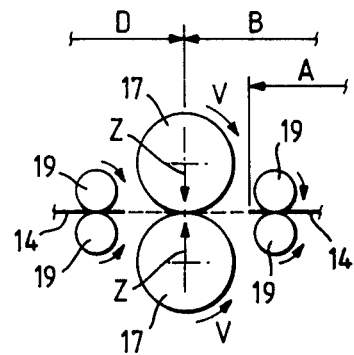

After a sufficient amount of time has elapsed to allow the rear edge of the board to pass beyond the zone where the brushes make contact with the passing boards, the said brushes are brought together again and continue to rotate at a velocity (V) while waiting for the next board (FIG. 15).

The boards leaving the machine are complete and perfectly polished except for the rear edge which, as stated, is of no importance.

The encoder 3 is a pulse generator which emits pulses as it is rotated by the chain 20. The encoder is selected such that it emits a predetermined number of pulses per centimeter of board advance driving movement of the feed rollers 16 and 19. A satisfactory encoder emits 100 pulses per centimeter of such driving movement.

As shown at FIG. 1A, the processor 5 has an input interface 100, an output interface 102, and a connector bus 103 which interconnects these interfaces with the with the units of processor 5.

Processor 5 includes a microprocessor 104, a ROM 106, a RAM 108, a program memory 110, and a RAM data memory 112.

During installation of the control system, the processor 5 is programmed with the fixed dimensional parameters of the polishing machine. These parameters include the distance B from the photocell 1 to the axes of the first set of brushes 17, the distance D between the brushes 17 and 17A, the distance D' between the brushes 17A and 17B, and the distances G and G' and G" between the respective feed rollers 19–19C. G, G', and G" are usually the same for a particular machine. This information is stored in a portion of ROM 106 in the form of a numerical quantity or count corresponding to the pulses per centimeter of feed roller driving advance generated by the encoder 3, and is programmed into and stored in ROM 106. Such programming can be done with calibrated selector switches associated with ROM 106.

RAM 108 is used for reading and storing certain data and for performing the computations and comparisons required for control of the apparatus. The RAM 108 has memory banks designated M1–M3, and MR, for purposes of explanation.

The program memory 110 contains the program and data to start and control the polishing machine apparatus.

The data RAM 112 is programmable by input selectors which are set to input variable information such as the length A of boards to be cleaned and the distances C C', C", from the trailing edge of a board where the brushes are stopped or reversed.

The speed of the board drive feed rollers can be adjusted by adjusting the variator drive 4.

As shown at FIG. 1A, in the power unit 6, variator drive 4 has an on-off relay 118, and the brush drive motors 7, 7A, and 7B have respective forward rotation relays 120, 120A, and 120B, and reverse rotation relays 122, 122A, and 122B. A master switch 124 is provided to control the power to the several motors to avoid accidental start-up, and to permit shut-down in the event of a malfunction.

The power unit 6 can also have relay switches 130, 130A, and 130B, which function when energized, to disconnect the motors 7, 7A, and 7B from the reverse rotation relays, and connect these relays to solenoid actuated valves V, VA, and VB. These valves, are each connected to the source of pressurized fluid P, and have respective output pipes 132, 132A, and 132B, which are connected respectively to the rod ends of brush retracting cylinders 40, at each of the polishing stations. Each valve, when energized, directs pressurized fluid from source P to its respective cylinders 40 at these stations. Relay switches 132, 132A, and 132B, can be energized manually by closing switch 134 to connect the relays to a compatible voltage source. In the explanations which follow, switch 134 is open except when the apparatus is operated according to FIGS. 12–15.

The operation of the processing unit 5 to control the mode of operation of the polishing machine is selected by setting the selector 8, as previously explained.

When the selector is switched to position 10, the machine operates in the mode, shown at FIGS. 4–7, in which each brush rotates in the direction of travel of the boards but is stopped slightly before the trailing end of each board is engaged by the brushes.

The length A of the boards to be cleaned is entered into DATA RAM 112. Manual in-put selectors calibrated in terms of board length in cm. can be used to input this data. The operator need only input the length information in centimeters, and this information is automatically converted to the corresponding pulse count data, i.e. 100 counts per centimeter.

Setting the selector 8 to position 10 programs processor 5 to compute the quantities:

$$L = A + B - C,$$

$$L' = L + D,$$

$$L'' = L + 2D,$$

in terms of pulse count movement and to store these quantities in the respective memory locations 500D, 600D, and 700D, of memory bank MR, of RAM 108. There is also stored in memory locations 550D, 650D, and 750D, a count equal to the respective counts in 500D, 600D, and 700D, plus a count equal to the additional distance a board must travel for its trailing edge to be downstream of and clear of the brushes. This is usually several additional centimeters of board travel.

Upon starting, the microprocessor 104 interrogates ROM 106, for the startup information, and closes relay switches 118, 120, 120A, and 120B, so that the variator is energized to drive the feed rollers, and the brush motors drive the brushes in the direction of travel of a board to be cleaned.

The boards 14 are fed into the polishing machine in spaced apart relation on conveyor 13.

A first board to be cleaned is placed on conveyor rollers 13 and is fed toward photocell 1. When the leading edge of the first board 14 actuates the photocell, the pulse out-put of encoder 3 is counted into three different memory locations 500, 600 and 700, of memory bank M1 of RAM 108.

The count in location 500 is continually compared with the count in location 500D, and relay switch 120 is opened to de-energize and brake brush motor 7 when the count in location 500 is the same as in location 500D, and is equal to L. The brushes 17 are thus stopped when the trailing edge of the board is at the distance C upstream from the brushes 17 so that the trailing edge of the continuously fed board is not damaged as it passes between and then leaves the brushes 17. Pulses from encoder 3 continue to count into location 500, after the brushes stop, and the count in location 500 is compared with the count in location 550D. When the count in 500 equals the count in 550D, relay switch 120 is closed, to again rotate the brushes 17 in the direction of travel of the boards, to receive the next board, while the first board continues to travel downstream from the brushes 17.

The count in location 600 is continually compared with the count in location 600D (which is L'), and relay switch 120A is opened to de-energize and brake brush motor 7A when the count in location 600 is the same as in location 600D, and is equal to L'. The brushes 17A are thus stopped when the trailing edge of the first board is at the distance C from the brushes so that the trailing edge of the board is not damaged as it passes between and then leaves the stopped brushes 17A. Pulses from encoder 3 continue to count into location 600, after the brushes stop, and the count in location 600 is compared with the count in location 650D. When the count in 600 equals the count in 650D, the trailing end of the board is downstream of and clear of the brushes, and relay switch 120 is closed, to again rotate the brushes 17A in the direction of travel of the boards, while the first board continues to travel downstream from the brushes 17A.

The count in location 700 is continually compared with the count in location 700D (which is L"), and relay switch 120B is opened to de-energize and brake brush motor 7B and stop brushes 17B when the count in location 700 is the same as in location 700D, so that the trailing edge of the first board is again not damaged as it engages and then leaves the stopped brushes 17B. Pulses from encoder 3 continue to count into location 700, after the brushes stop, and the count in location 700 is compared with the count in location 750D. When the count in 700 equals the count in 750D, the firstboard is clear of the brushes, and relay switch 120 is closed, to again rotate the brushes 17B in the direction of travel of the boards, while the first board continues to travel downstream from the brushes 17B, to the washing and rinsing stations.

When the leading edge of the second board 14 actuates the photocell 1, the pulse out-put of encoder 3, is also counted into memory locations 500A, 600A and 700A, of memory bank M2 of RAM 108, and the count in these locations is compared with the count quantities indicative of L in memory location 500D, L' in memory location 600D, and L" in memory location 700D. The operation for the second board is then the same as described above for the first board.

When the leading edge of the third board 14 actuates the photocell 1, the pulse out-put of encoder 3, is counted into memory locations 500B, 600B and 700B, of memory bank M3 of RAM 108, and the count in these locations is compared with the count quantities indicative of L in memory location 500D, L' in memory location 600D, and L" in memory location 700D. The operation for the third board is then the same as described above for the first board.

Where there are three set of brushes 17, 17A, and 17B, only three memory banks are required to count the counts from encoder 3. If there is a fourth set of brushes, another memory bank is used.

The detection of a first board by photocell 1, only enables memory bank M1 to receive counts from encoder 3. The detection of the second board enables memory bank M2 to receive counts from the encoder, and the detection of the third board enables memory bank M3 to receive counts from encoder 3.

When the count in location 500 equals the count in location 550D, location 500 is inhibited from receiving counts from the encoder until the fourth board, i.e. a new first board triggers photocell 1. Similarly, when the count in location 600 equals the count in location 650D, location 600 is inhibited from receiving counts from the encoder until the fifth board, i.e. a new second board triggers photocell 1, and when the count in location 700 equals the count in location 750D, location 700 is inhibited from receiving counts from the encoder until the sixth board, i.e. a new third board triggers photocell 1.

Thus, each board entering the machine is always in the same precide starting position relative to the respective brushes when the photocell triggers its memory location to receive counts from encoder 3. Error accumulation is thus avoided, and uniform spacing of boards fed to the machine is not required.

In an alternative mode of operation similar to that of the selector in position 10, each brush motor is reversed, just after it is stopped, to rotate its brush in a direction opposite to the direction of travel of a board, just before the trailing edge of the board is engaged by the brushes. In this mode of operation relay switch 120 is opened, as before, to de-energize and brake brush motor 7 when the count in location 500 is the same as in location 500D. After a short time delay sufficient to stop motor 7, relay switch 122 is closely to reverse the rotation of the motor so the first set of brushes 17 rotate opposite to the direction of travel of the board 14, as the trailing end of the board is engaged by the brushes, so that the trailing edge of the board is not damaged as it leaves the brushes. When the count in 500 equals the count in 550D, relay switch 122 is opened, and relay switch 120 is closed, to rotate the brushes 17 in the direction of travel of the next board fed by conveyor 13. The operation is the same for motors 7A and 7B.

Operation in this reversing mode only requires the additional instructions to close relay switches 122, 122A, and 122B, just after switches 120, 120A, and 120B, are opened, and to first open relay switches 122, 122A, and 122B, before closing relay switches 120, 120A, and 120B.

When the selector is swithced to position 9, the machine operates in the mode, shown at FIGS. 8-11, in which each brush initially rotates in the direction of travel of the board to polish a portion of the board while rotating in this direction, but is stopped and reversed after the board is between the downstream feed rollers and slightly before the trailing end of the board leaves the upstream feed rollers. As mentioned above, the length A of the board must be greater than the distance between the feed rollers immediately upstream and downstream of each set of brushes to operate in this mode.

Setting the selector 8 to position 9 programs processor 5 to compute the quantities:

$$L1 = A + B - C,$$

$$L1' = L1 + G,$$

$$L1'' = L1' + 2G,$$

in terms of pulse count movement and to store these quantities in the respective memory locations 500D, 600D, and 700D, of memory bank MR, of RAM 108. There is also computed and stored in memory locations 550D, 650D, and 750D, a count equal to the respective counts in 500D, 600D, and 700D, plus a count equal to (C'+several cm.), i.e. the additional distance a board must travel for its trailing edge to be downstream of and clear of the brushes.

Then, when operated in this mode, the brushes again initially rotate in the direction of travel of the boards. The count in location 500 is continually compared with the count in location 500D (L1), and relay switch 120 is opened to de-energize and brake brush motor 7 when the count in location 500 is the same as in location 500D. After a short time delay sufficient to stop motor 7, relay switch 122 is closed to reverse the rotation of the motor so the first set of brushes 17, rotate opposite to the direction of travel of the board 14, while the board is still held by the feed rollers upstream and downstream of the brushes, so the board cannot buckle. The brushes continue to ratate in this reverse direction until the trailing end of the board is downstream of the brushes, so that the trailing end of the board is not damaged as it leaves the brushes. The count in location 500 is compared with the count in location 550D (L1+C'+several cm.), and when the count in 500 equals the count in 550D, relay switch 122 is opened, and relay switch 120 is closed, to again rotate the brushes 17 in the direction of travel of the boards, to receive the next fed board.

The operation is the same at brushes 17A, where the rotation of the brushes reverses at the distance L1', and at the brushes 17B, where these brushes reverse at the distance L1".

In the variation of the FIGS. 8–11 with selector 8, in position 9, the brushes reverse at slightly different locations at each station. This variation programs processor 5 to compute the quantities:

$L1 = A + B - C,$ $L'11 = (A + B + G) - C'',$ $L''11 = (A + B + 2G) - C''',$ in terms of pulse count movement and to store these quantities in the respective memory locations 500D, 600D, and 700D, of memory bank MR, of RAM 108. There is also computed and stored in memory location 550D, a count equal to the count in 500D plus (C′+several cm.), in location 650D, a count equal to the count in 600D plus (C″+several cm.), and in location 750D, a count equal the count in 700D plus (C‴+several cm.), i.e. the additional distance a board must travel at each of the respective brushes, after the brushes are reversed, for its trailing edge to be downstream of and clear of the brushes, before the brushes are again rotated in the direction of travel of the boards.

When selector 8 is set to position 11, only the start-up data from ROM 106 is used to close switches 118, 120, 120A, and 120B, so that brushes 17, 17A, and 17B always rotate in the same direction. The operation of the polishing machine is then the same as it was before the processor 5 was installed.

FIGS. 12–15, show a variation of the operation with the selector in position 11, in which the brushes are lifted just before the trailing edge of the board would be engaged by the brushes.

In this variation, switch 134 is closed to energize the relay switches 130, 130A, and 130B, to disconnect the motors from the reversing lines and to connect these lines to the respective valves V, VA, and VB. Thus, when the respective reverse relay switches are energized, the respective valve are energized to admit pressurized fluid to the rod ends of the cylinders 40.

In this variation, the switches 120, 120A, and 120B remain closed. The program used is quite similar to the program used for the operation shown at FIGS. 4–7, in which the brushes stop just before the trailing end of the board is engaged by the brushes. The processor is however, instructed to close respective relay switches 122, 122A, and 122B, to thus retract the brushes just before the trailing end of a board reaches the brushes, and to return the brushes to the working position after the trailing end is downstream of and clear of the brushes.

In this variation with selector 8 in position 11 the processor 5 is caused to compute the quantities:

$L = A + B - C,$ $L' = L + D,$ $L'' = L + 2D,$ in terms of pulse count movement and to store these quantities in the respective memory locations 500D, 600D, and 700D, of memory bank MR, of RAM 108. There is also stored in memory locations 550D, 650D, and 750D, a count equal to the respective counts in 500D, 600D, and 700D, plus a count equal to the additional distance a board must travel for its trailing edge to be downstream of and clear of the brushes.

The processor is however, instructed to closed switch 122, when the count in memory location 500 equals the count in location 500D, and to open the switch 122 when the count in memory location 500 equals the count in memory location 550D. Closing relay switch 122 (with relay switch 130 energized), actuates valve V to direct pressure fluid to the cylinders 40 of brushes 17, to retract the brushes 17. Opening switch 122 de-energises the valve V to vent the fluid from the cylinders for brushes 17, and permit the springs of the cylinders to return the brushes to the working positions.

Valve VA is similarly energized when the count in location 600 equals the count in location 600D, and de-energized when the count in location 600 equals the count in 660D. Valve VB is energized when the count in location 600 equals the count in location 600D, and de-energized when the count in location 600 equals the count in 660D. Thus each set of brushes at each station is retracted just before the trailing end of a board would be engaged by the brushes, and thin boards are not damaged even though the brushes rotate continuously.

Finally, as already stated and as will certainly have been appreciated, the apparatus proposed by the invention may be associated with all types of cleaning machines of the known prior art.

It is understood that the invention is not limited to only those embodiments described above and that variations and improvements may be made without, however, going outside the scope of the invention, the fundamental characteristic features of which are specified in the following.

I claim:

1. An operating and control apparatus for board-cleaning machines of the type comprising at least one horizontal cylindrical brush (17) as well as means (19) for feeding the boards (14) to be cleaned, characterised in that it comprises a reading member (1) capable of detecting the presence of the incoming board (14), a device (3) designed to control the forward movements of the board (14), a memory for storing the dimension (A) of the board (14) which is parallel to the direction of the movement of the latter, a motor unit (7) for driving said at least one brush (17) in the same direction as the feeding direction of the board (14), as well as a processor (5) designed to collect and process the signals output from the said member (1) and device (3) and to compare them with the data stored in the said memory so as to operate, by means of a special power unit (6), the said motor unit (7), so that it causes said at least one brush (17) to rotate, when the latter is engaged with the rear end part of the board, at a velocity having absolute values greater than or equal to zero and in the opposite direction to the direction in which the board (14) is fed, in accordance with a predetermined method of operation.

2. The apparatus according to claim 1, characterised in that the said reading member comprises at least one photocell device (1) situated in a fixed position upstream of the means (19) for feeding the boards (14), which means are located further upstream.

3. The apparatus according to claim 1, characterised in that the said device designed to control the forward movements of the boards (14) comprises an encoder (3) which is intended to be associated with the driving means (4,20) which actuates the means for feeding the boards (14).

4. The apparatus according to claim 1, characterised in that the said motor unit for driving said at least one brush (17) comprises a motor (7) of the self-braking type.

5. The apparatus according to claim 1, characterised in that the said processor (5) comprises counting, comparison, timing, memory and control circuits for processing the signals output from the said member (1) and device (3), in accordance with the dimension (A) stored in the said memory, and for sending to the power unit (6) signals which control the operation of the motor (7).

6. Operating and control the apparatus for board-cleaning machines of the type comprising at least one horizontal cylindrical brush (17) mounted on means movable in a direction perpendicular to the plane of movement of the boards, as well as means (19) for feeding the latter, characterised in that it comprises a reading member (1) capable of detecting the presence of the incoming board (14), a device (3) designed to control the forward movements of the boards (14), a memory for storing the dimension (A) of the board (14) which is parallel to the direction of movement of the latter, a motor unit (7) for driving said at least one brush (17) in the same direction as the direction in which the board (14) is fed, as well as a processor (5) designed to collect and process the signals output from the said member (1) and device (3) and to compare them with the data stored in the said memory so as to cause, via a special power unit (6) the said movable means to move away from the plane of movement of the boards when the brush (17) is engaged with the rear end part of the said boards.

* * * * *

UNITED STATES PATENT AND TRADEMARK OFFICE
CERTIFICATE OF CORRECTION

PATENT NO. : 4,782,545

DATED : November 8, 1988

INVENTOR(S) : Umberto Aiassa

It is certified that error appears in the above-identified patent and that said Letters Patent is hereby corrected as shown below:

On the title page Insert

--(73) Assignee: International Supplies Company S.r.l.
Parma, Italy --.

Signed and Sealed this

Seventh Day of November, 1989

Attest:

JEFFREY M. SAMUELS

Attesting Officer     Acting Commissioner of Patents and Trademarks